United States Patent
Bechaz et al.

(10) Patent No.: US 6,848,951 B1
(45) Date of Patent: Feb. 1, 2005

(54) INTERFACE DEVICE BETWEEN PIECES OF EQUIPMENT OF A PLANT

(75) Inventors: Bernard Bechaz, Caluire (FR); Jean-Paul Gaillard, Lyons (FR); Christophe Louis-Chevrau, Lyons (FR)

(73) Assignee: Entrelec S.A., Villeurbanne (FR)

( * ) Notice: Subject to any disclaimer, the term of this patent is extended or adjusted under 35 U.S.C. 154(b) by 0 days.

(21) Appl. No.: 09/185,615

(22) Filed: Nov. 4, 1998

(30) Foreign Application Priority Data

Nov. 19, 1997 (FR) .......................................... 97 14507

(51) Int. Cl.[7] .................................................. H01R 9/26
(52) U.S. Cl. ...................................... 439/716; 439/717
(58) Field of Search .................... 703/25, 27; 439/717, 439/928, 715, 716; 361/728, 729, 730, 731, 732, 735, 747

(56) References Cited

U.S. PATENT DOCUMENTS

| | | | | |
|---|---|---|---|---|
| 4,368,939 A | * | 1/1983 | Foederer ..................... | 439/594 |
| 4,451,107 A | * | 5/1984 | Dola et al. .................. | 439/608 |
| 4,469,393 A | * | 9/1984 | Chewning, Jr. et al. .... | 439/717 |
| 4,729,744 A | * | 3/1988 | Bet et al. .................... | 439/717 |
| 4,872,092 A | | 10/1989 | Lush et al. .................. | 361/823 |
| 4,975,069 A | * | 12/1990 | Fedder et al. ............... | 439/101 |
| 5,072,185 A | * | 12/1991 | Rockwell ..................... | 324/539 |
| 5,380,210 A | * | 1/1995 | Grabbe et al. ............... | 439/66 |
| 5,385,490 A | * | 1/1995 | Demeter et al. ............. | 439/579 |
| 5,549,490 A | * | 8/1996 | Buetas ........................ | 439/724 |
| 5,584,728 A | * | 12/1996 | Cheng ......................... | 439/637 |
| 5,716,241 A | * | 2/1998 | Hennemann et al. ....... | 439/716 |
| 5,745,338 A | * | 4/1998 | Bartolo et al. .............. | 361/637 |
| 5,893,778 A | * | 4/1999 | Mansutti ..................... | 439/701 |
| 5,924,899 A | * | 7/1999 | Paagman ..................... | 439/701 |
| 5,967,844 A | * | 10/1999 | Dourtrich et al. ........... | 439/607 |

FOREIGN PATENT DOCUMENTS

| | | |
|---|---|---|
| DE | 25 07 904 A1 | 9/1976 |
| DE | 44 10 817 C1 | 2/1995 |
| DE | 44 38 805 C1 | 3/1996 |
| FR | 2 548 511 A1 | 1/1985 |

* cited by examiner

Primary Examiner—Sam Rimell
(74) Attorney, Agent, or Firm—Oliff & Berridge, PLC

(57) ABSTRACT

An electrical and/or optical interface device between a first piece of equipment, especially of the automatic-machine type, and at least one other piece of equipment of an industrial plant, is disclosed. The device is capable of receiving at least one multipoint connector for serving communication channels between functional elements of the first piece of equipment and functional elements of at least said other piece of equipment, and it is made in the form of a modular assembly whose components are distributed among an alignment of functional modules, of the terminal-block type, that are placed side by side. Each communication channel is served by a functional module containing the interface components which fulfill out the functions that relate to this channel and receiving the multipoint connector part serving this channel, the various functions carried out by the interface device being distributed among various functional modules of said alignment.

35 Claims, 2 Drawing Sheets

FIG_1
PRIOR ART
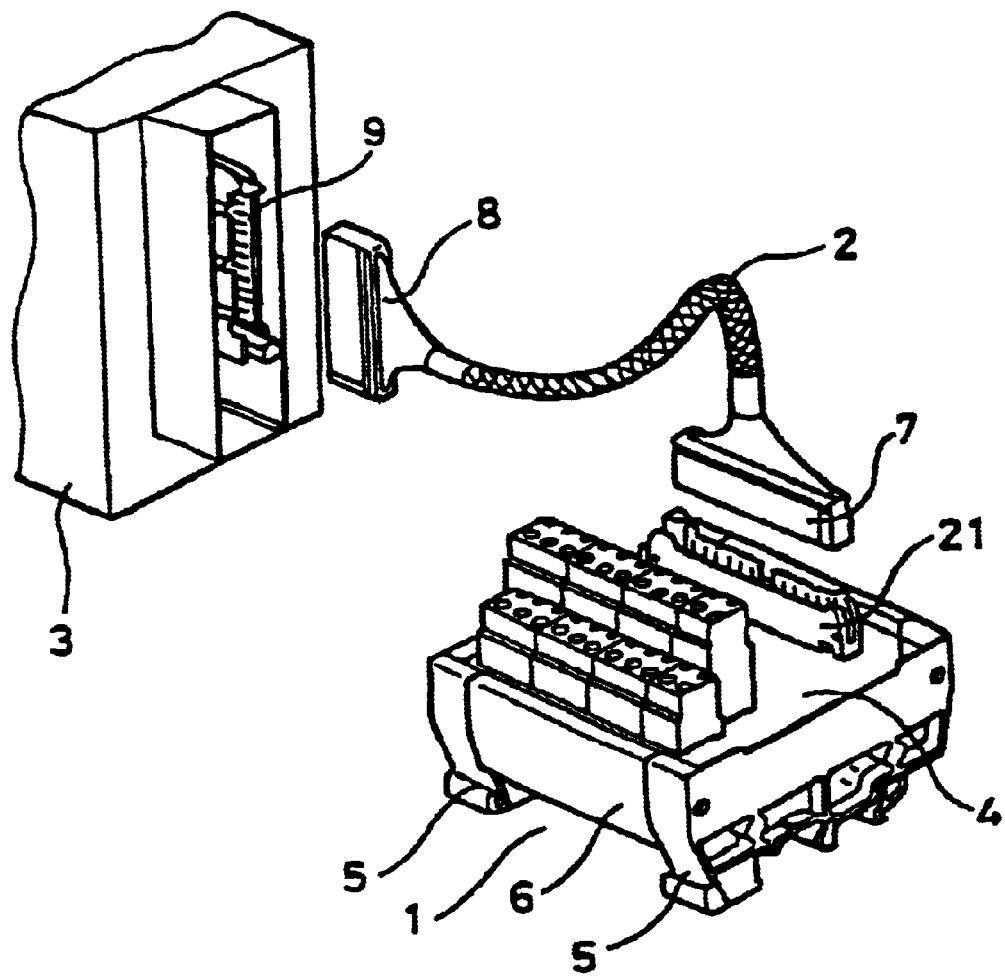

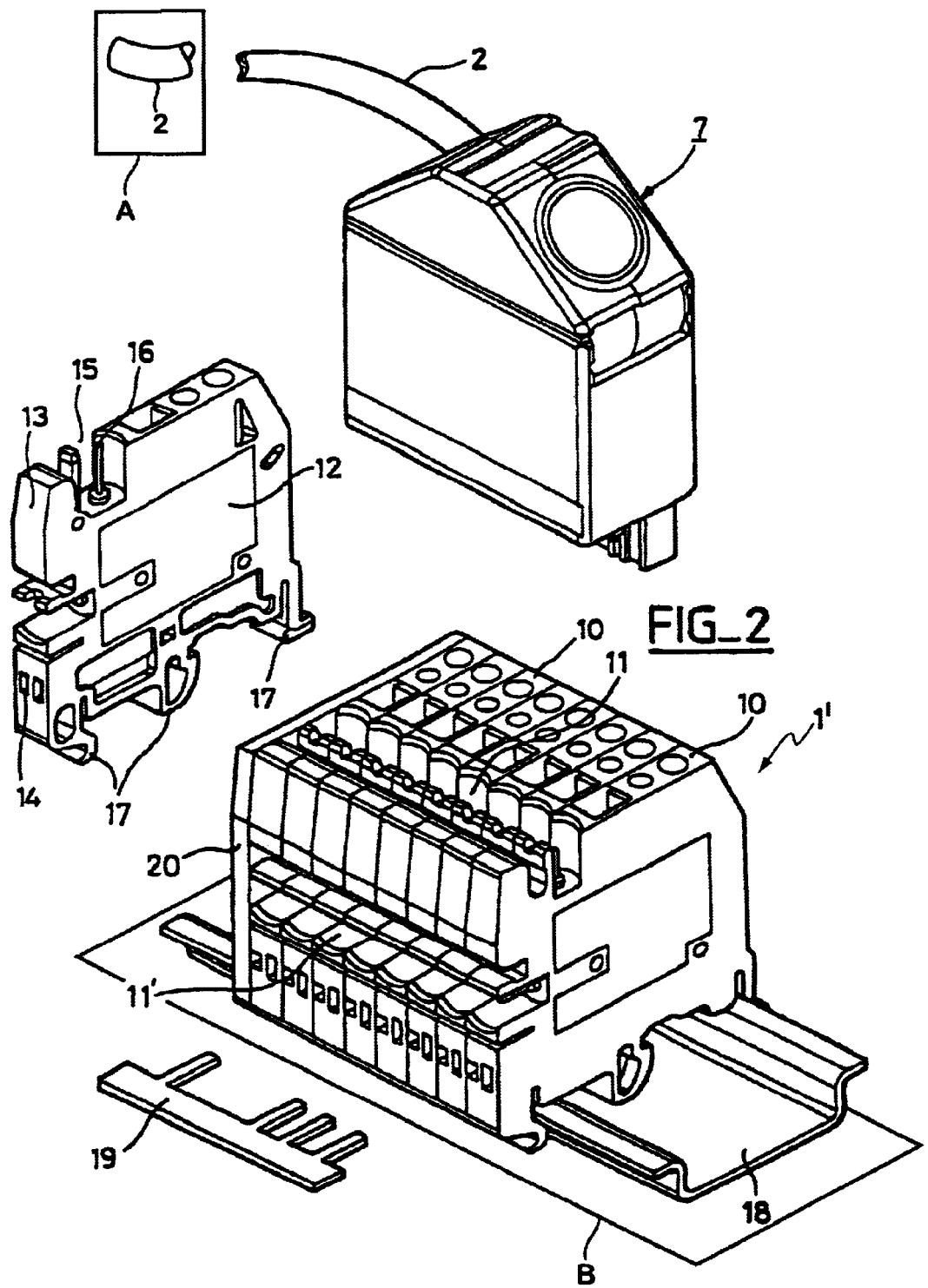

INTERFACE DEVICE BETWEEN PIECES OF EQUIPMENT OF A PLANT

BACKGROUND OF THE INVENTION

The invention relates to an electrical and/or optical interface device for an industrial plant where a first piece of equipment, especially of the automatic machine type, is linked to at least one other via the interface device to which it is connected by means of at least one multipoint connector.

Many industrial plants comprise pieces of equipment and especially automatic industrial machines whose operation involves connecting at least one other place of equipment, especially to a piece of equipment for management, via electrical-wire and/or optical-fiber links for transmitting signals and power. Moreover, it is frequently the case that connecting one piece of equipment to another requires adaptation so that what is transmitted by one can be used by the other, and vice versa if necessary. It is therefore usual to make interface devices allowing such inter-equipment adaptations. Such an interface device may be directly incorporated into a piece of equipment to be interconnected with another, may be distributed among the two pieces of equipment to be interconnected or else may be constructed as an independent unit to which the pieces of equipment are connected by wire or fiber links.

As is known, making an interface device in the form of an independent unit has in particular the advantage of allowing two pieces of equipment to be used, after they have been connected together, without having to materially modify these pieces of equipment, when the latter are not originally designed to operate directly with each other without any adaptation. The pieces of equipment to be interconnected by means of such a unit are linked to it by means of links and it is conventional to provide the links with male or female connectors allowing them to be mated with complementary connector elements on the unit and/or on the pieces of equipment in order to allow rapid connections and disconnections, as well as easy equipment or interface-unit substitutions, if required.

There are therefore many inter-equipment interface devices which are made in the form of independent units to which the pieces of equipment to be interconnected are connected.

Moreover, it is common practice to physically join together the connection interfaces of the same plant, or of the same one functional assembly of a plant, with a certain number of electrical and/or optical connection components and, for example, terminal blacks used for electrical power distribution, in particular for making the work of maintenance staff easier.

In a known embodiment, the terminal blacks and other connection components rise attachment pieces which allow them to be mounted on support rails of standardized shape and size. There are interfaces such as those mentioned above which are made in the form of printed circuit boards and which are combined with means allowing them to be mounted on support rails, each board having conducting tracks and carrying electrical, electronic and/or optical components.

Document FR-A-2,548,511 describes especially a simplified configuration of a motherboard-type device allowing a printed circuit board to be mounted on a standardized support rail, parallel with this rail, by means of two feet for fixing to the rail, on which feet will be mounted four bars, called card holding and locking bars respectively, which immobilize this card by its edges.

It is thus possible to make interface devices for very diverse pieces of equipment simply by assembling and connecting them according to techniques very widely employed after producing a suitable electrical circuit using conducting tracks made on a printed circuit board.

Designers therefore have very great construction flexibility, but this has the drawback of resulting in a very wide variety of constructions since there is minimal standardization in this context and it may be difficult to find a replacement card that is directly substitutable for a defective card. It may also be necessary to replace an entire card in order to be able to make a relatively minor modification if such a modification had not been anticipated and if the initially provided configuration of the board does not lend itself thereto.

Moreover, printed circuit boards have the drawback of being relatively fragile if one considers the elements with which they are likely to come into contact on a support rail and the wire or cable links with which they way be required to engage.

SUMMARY OF THE INVENTION

The invention therefore proposes an interface device, provided with components acting as intermediaries between a first piece of equipment, in particular of the automatic machine type, and at least one other piece of equipment of an industrial plant, which is capable of receiving at least one multipoint connector for connection to the first piece of equipment. This multipoint connector is provided especially for serving communication channels between functional elements of the first piece of equipment and functional elements of at least said other piece of equipment which are established by means of electrical linking wires and/or optical linking fibers.

According to one characteristic of the invention, the interface device is made in the form of a modular assembly, the components of which are distributed among an alignment of functional modules, of the terminal-block type, placed side by side and optionally interconnected electrically and/or optically, where each communication channel is served by a functional module containing the interface components which fulfill the functions that relate to this channel and receiving that part of the multipoint connector serving this channel. The various functions carried out by the interface device are distributed among various functional modules of said alignment.

According to the invention, matching, switching, control relaying, protection and/or signaling functions are distributed among the various functional modules of the modular assembly which correspond to the channels for which they are respectively employed.

According to one embodiment of the invention, the device consists of an alignment of modules placed side by side, which is capable of receiving at least one multipoint connector of a first piece of equipment which together define at least one multipoint connector complementary to this connector for the first piece of equipment, said modules having a thickness, along their alignment axis, which is equal to or is a multiple of the pitch of said connector.

The invention, its characteristics and its advantages are detailed in the following description in conjunction with the figures mentioned below.

BRIEF DESCRIPTION OF THE DRAWINGS

FIG. 1 shows an example of a known interface device associated with a piece of equipment of an equipment assembly.

FIG. 2 shows an example of an interface device according to the invention, an equipment connector and, shown separately, a module.

DESCRIPTION OF PREFERRED EMBODIMENTS

As indicated above, FIG. 1 shows a known interface device 1 beside which is placed a wire or fiber supply link 2 assumed to be designed to bring the interface device electrically and/or optically into communication with a first piece of equipment 3 of an industrial plant comprising at least two pieces of equipment, only the first of which is illustrated. These pieces of equipment are assumed to be provided with functional elements, not illustrated, that the interface device 1 is capable of bringing into communication.

For this purpose, the interface device 1 comprises components capable of ensuring compatibility between the pieces or equipment that the interface device links, if so required. The known interface device 1 is made in the form of a motherboard comprising a printed circuit board 4 mounted in a frame having two feet 5 for fixing to a standardized rail and two cross-pieces 6 which link the feet and help to keep the card in place in the frame.

Various components of the interface device 1, particularly electrical, electronic and/or optical components, can be mounted on the board for inter-equipment adaptation purposes, as already mentioned above, or for other purposes and, for example, for switching, signaling or protection requirements.

The example shown in FIG. 1 is especially provided with a connector body corresponding to a male multipoint connector 6 intended to receive a complementary female connector 7 with which the link 2 is fitted. The connector body of the male connector 21 is fixed to the printed circuit board 4, for example by means of bolts, and it is linked to conducting tracks on this board via one end of each of the male connection members that it contains. These connection members, which are not illustrated, are for example plugged into, for example, plated-through holes made in the tracks on the board.

The link 2 is assumed here to be provided with a connector 8 capable of being connected to a complementary connector 9 of the first piece of equipment 3 in order to allow functional elements, not illustrated, of this first piece of equipment to be selectively linked to the various wires of the link and consequently to corresponding components provided in the interface device 1. The functional elements of the first piece of equipment can be highly varied, some of them being, for example, of the sensor type and others being, for example of the actuator type.

In the embodiment shown in FIG. 1, the printed circuit board 4 is assumed to have two rows of connection terminals intended, for example, to allow wires, not illustrated, coming from at least one other piece of equipment, also not illustrated, of the assembly which includes the first piece of equipment 3 to be connected in order to bring these pieces of equipment into communication with each other via the interface device 1.

The example of an interface device 1 according to the invention shown in FIG. 2 is also assumed to be intended to be linked to at least two pieces of equipment, illustrated as elements A and B, of an industrial plant, for which it brings functional pieces of equipment into communication by providing the necessary adaptations, if so required.

This interface device 1 consists of an alignment or functional modules 10, these being, for example, in the form of terminal block, which are placed side by side and which together, form a modular assembly capable of receiving at least one multipoint connector 7 designed especially to serve communication channels between functional elements of a first piece of equipment and functional elements of at least one other piece of equipment of a plant. The aligned modules distribute the components, allowing the interface device to carry out the various functions which are imparted to it. Each communication channel is served by a module 10 which contains the components fulfilling the functions carried out in the interface device for this channel, this module also receiving that part of a multipoint connector 7 which relates to the channel that it serves.

The various functions capable of being carried out in the modules 10 and the components capable of being incorporated therein will be expanded upon below.

A connector is received in an interface device according to the invention via a complementary connector, namely, for example, a complementary male connector if the connector 7 assigned to the first piece of equipment is a female connector. In the example envisaged in FIG. 2, the connector 7 is assumed to be fitted onto a wire or fiber link 2 of a first piece of equipment of an industrial plant.

For this purpose, each module 10 is, for example, made in the form of a half-shell made of molded insulating material, including the and face 12 and optionally the perimeter wall 13 which goes around this end face. This end face and this perimeter wall are provided internally with reliefs, not illustrated, which, according to a well-known technique, allow various electrical and/or optical devices to be positioned. These components are especially electrical interconnection elements, for example of the strip kind, connection terminals for electrical wires, for example of the screw and clip type or of the type with a stripping and retaining slit, electrical components, or also electronic or electromechanical components, as well as their optical or optoelectronic equivalents.

The perimeter wall 12 of a module is conventionally perforated or recessed at defined locations in order to form apertures which can be used to pass elements from the outside into the module. As is known, this is essential when the housing that a half-shell of a module and the perimeter wall 13 which surrounds it delimits, is closed by an end face of another module or by an end plate, such as 20, which bears an the edge of the perimeter of the module to which it is fixed, when the interface device 1' is joined to the modules, placed side by side, of which it is composed. As is known, such apertures, like those labeled 14, particularly allow external wires and/or fibers to be inserted into the interface device in the various modules, for example in order to connect external wires or fibers to connection terminals housed in the modules.

In the embodiment envisaged, at least one aperture for a duct, labeled 15, is also provided in the perimeter wall 13, for example at the top of each module, in order to allow insertion of a complementary part of an external multipoint connector 7.

The duct 15 is assumed here to be a guiding duct intended to engage with a part of an external connector 7 that is formed so as to be able to slide into this duct, until complete connection of at least one connection member of which the duct is composed with at least one complementary connection member, not illustrated, of which that part of the external connector 7 is composed.

The guiding duct 15 is, for example, bounded by reliefs projecting internally from the bottom of the half-shell formed by a module as far as level with its aperture in the perimeter wall 12 of this module. It is assumed here to have a bottom from which a pin-type connection member 16 projects, the complementary member being, for example, of the resilient clamp type, as is known in this context.

The guiding ducts 15 of the various modules communicate laterally with one another insofar as each of them opens over its length into the wall making up the and face 12 of the module which comprises it. Each module therefore defines an elementary part of a multipoint connector 11 which is formed only when the module is placed beside a defined number of identical, or possibly similar, aligned modules. The number of modules in an interface device necessary for forming a connector complementary to a given external connector depends, of course, on the number of communication channels to be served and therefore on the number of connection points that the external connector has, and the thickness of the modules along their alignment axis necessarily corresponds to the pitch common to their connection points and to those of the external connector envisaged. It should be understood that a communication channel assumed here to be via single wire or fiber may optionally employ more than one separate wire or fiber and therefore entail the use of more than one connection point in a multipoint connector which serves this communication channel.

The distribution of the connection points or members of the external connector is, of course, closely linked with that of the complementary connector consisting of modules placed side by side - here the distribution is assumed to be linear with one point, that is to say one individual connection member, per guiding duct 15; of course, it is possible to envisage embodiments with connectors in which the points are distributed over more than one line in the same duct or in several ducts per module.

It is conceivable to produce modules with a thickness, and therefore a pitch, that is a multiple of the pitch specific to the connection points of an external connector, this aspect not being amplified here insofar as such an adaptation is within the scope of those skilled in the art.

It is also possible to produce interface devices having more than one connector made by means of aligned modules placed side by side, the connectors formed being capable of being either aligned and produced using separate modules or of being parallel and carried by the same modules which are then provided with one or more suitable ducts 15, as shown in FIG. 2 where two separate connectors 11 and 11' are illustrated.

In the embodiment shown in FIG. 2, the modules 10 are designed to be aligned along a support rail on which these modules are then mounted, either in succession or as a pre-assembled unit. This is especially the case if, as in the example shown in FIG. 2, the modules have fixing feet 17 intended to allow them to be fastened to a standardized support rail 18.

Pre-assembly of the modules 10 of an interface device may be carried out with the aid of removable means of fastening between modules of the same device. This pre-assembly may, for example, be performed by one or more fastening elements common to the modules or else by the snap-fastening of fixing elements carried by one module into complementary fixing elements carried by a module which is placed beside it, each module having fixing elements and complementary elements distributed, for example, on each side of its end face wall. As is known, one of the modules located at one end is then able to be fitted with a closure plate insofar as there is no provision for another module to close it off. It In thus possible to construct an interface device in the form of a whole assembly which can be handled separately before it is fitted, the modules forming this whole assembly being able to be dismantled in order to remove any one of these modules, if so required.

An indicated above, it is intended that each of the modules of an alignment, which are placed side by side in order to form a connector, houses the various components specific to the communication channel served by the connector part of which the module in question is composed for engaging with a complementary external connector. This is especially made for the connection member or members 16 of the connector part 11 or 11' of which the module is composed. Insofar as in many cases, and in particular with automatic industrial machines, the functional elements to be brought into communication via an interface device are electrically or optically accessible in single-pole or separable configurations in a simple manner, for example one-pole, two-pole, three-pole or four-pole configurations, it is possible to provide standardized modules of the interface device according to the invention which make it possible to ensure connection by connector of these pieces of equipment to interface devices comprising connectors made by the alignment of modules side by side. The functions carried out in a functional module are matching, switching, control-relaying, protection and/or signaling functions.

The matching functions are, for example, capable of being carried out by means of simple circuits known per se, and especially electrical, electronic or electrooptic circuits mounted in a module and connected to at least one connection member 16 of a part of a connector of which this module is composed and, depending on the case, to at least one other connection member of a part of another connector of this module or to at least one connection terminal of which this module is also composed, in order to connect an external wire or fiber. Each module may thus have at least one additional input and/or output, the latter usually being based on one, two, three or four wires or fibers, in addition to at least one connection member belonging to part of a connector of which it is composed. A one-wire or one fiber input/output of a module can be nods direct, isolatable or protected by a fuse, with, as required, a component of the isolating type or of the fuse type housed in the module which comprises it. A two-wire or two-fiber input/output is especially capable of serving a sensor by separately transmitting a potential, for example one common to a plurality of modules, and a return signal specific to the module in question. A three-wire or three-fiber input/output is, for example, capable of serving a sensor by separately transmitting two potentials, common to a plurality of modules, and a return signal specific to the module In question.

It is envisaged to produce interface devices constructed using alignments of modules side by side made in a standardized manner before fitting them, in order to meet the requirements of devices for pieces of equipment, especially automatic machines, that are mass-produced. These devices have the advantage of being able to be easily disconnected should a modification or repair be required and, in many cases, of allowing an upgrade to be made or a fault to be cleared simply by substituting one module for another. These blocks then form a whole assembly which it is possible to handle separately and to move as required, for example for sale in the form of a prefitted assembly.

It is also envisaged to electrically link together terminals of the interface device that are located on different modules of the device by conducting interconnection elements, such as the external interconnection comb 19 provided with teeth which are intended to be placed in the wire-insertion holes of aligned terminals of side-by-side modules, thereby allowing external wires to be inserted and thereby electrically linking these terminals, the teeth being isolatable so as to allow links to be made to only some of the terminals of an alignment or so as to provide a pitch that is a multiple of the initial pitch of the teeth.

It is also envisaged to use internal interconnection elements parallel to the alignment axis of the side-by-side modules, these elements, of the conducting-rod type, then passing through apertures made at the same level in the respective end face walls of the modules of an alignment in order to establish an electrical link with conducting parts of electrical components housed in the modules.

All this makes it possible to construct most one-pole, two-pole, three-pole or four-pole circuits, especially electrical circuits usually employed in interface devices and in particular to incorporate the most common of these circuits in modules that are identical or compatible with each other. The circuit contained in one module is linked to the connection member or members of an elementary part or parts of a connector or connectors specific to this module, as well as to any terminal(s) and to any interconnection element(s) associated with the module.

What is claimed is:

1. An interface device for connecting one or more external multipoint connectors used to establish one or more functional communication channels between devices which employ electrical or optical conductors, comprising:
   a linear assembly of functional modules, said functional modules being positioned in alignment, in said linear assembly, each functional module having a peripheral wall and an end wall and defining an elementary part of one or more multipart connectors formed by a plurality of said functional modules and having substantially mutually perpendicular sides,
   wherein the modularly assembled multipart connector provides for direct connection, with one or more external multipoint connectors, using ducts in each of two substantially mutually perpendicular sides one of which ducts is a guiding duct in the peripheral wall and which opens over its length into the wall making up the end wall of its functional module, the ducts being adapted for interconnecting one or more electrical or optical conductors which form one or more functional communication channels and
   communication functions performed through the interface device are distributed among a plurality of aligned functional modules.

2. The interface device as claimed in claim 1, wherein the functions which may be performed by the functional communication channels include
   matching, switching, control
   relaying, protecting, and signaling.

3. The interface device as claimed in claim 1, wherein the linear assembly functional modules are configured to be complementary to at least one multipoint connector from a first piece of equipment, said modules having an alignment axis, and a thickness along their alignment axis which is equal to a unitary or larger multiple of the pitch of two connectors.

4. The interface device as claimed in claim 1, wherein the aligned functional modules are in a side-by-said configuration.

5. The interface device as claimed in claim 1, wherein one or more elements are provided to electrically interconnect one or more functional modules.

6. The interface device as claimed in claim 5, wherein each electrical interconnection element is provided through the outside of the modules.

7. The interface device as claimed in claim 5, wherein each electrical interconnection element is provided inside of the modules.

8. The interface device as claimed in claim 5, wherein each electrical interconnection element is disconnectable.

9. The interface device as claimed in claim 1, wherein the aligned functional modules are elongated and the elongated portions thereof are parallel to each other.

10. An interface device for connecting at least one external multipoint electrical and/or optical connector, comprising:
    a linear assembly of modules, each module comprising:
       an end wall and a perimeter wall, which goes around the end wall, delimiting an housing for an electrical and/or optical device;
       an electrical and/or optical device fitted in the housing; and
       a duct, with a fixed connection member extending partially into said duct, provided in the perimeter wall in order to form a part of a multipart connector complimentary to the external multipoint connector, the connection member being connected at least to the electrical and/or optical device, the duct is a guiding duct in the peripheral wall and opening over its length into the wall making up the end wall of its functional module; and
       a multipart electrical and/or optical connector, configured to receive the external multipoint connector, constituted by the linear alignment of the ducts of the modules placed side by side with each module in direct contact with an adjacent module.

11. The interface device as claimed in claim 10, wherein the duct of each module is a guiding duct provided for engaging a part of the external multipoint connector.

12. The interface device as claimed in claim 10, wherein each module comprises an aperture provided in the perimeter wall in relation of which a electrical and/or optical connection terminal is fitted, the connection terminal forming at least a part of the electrical and/or optical device fitted in the module.

13. The interface device as claimed in claim 10, wherein each module comprises fastening means in order to fasten the module to a next module.

14. The interface device as claimed in claim 10, wherein each module has a thickness, corresponding to the width of the perimeter wall, which is equal to a unitary or larger multiple of the pitch of two connection members of the external multipoint connector.

15. The interface device as claimed in claim 10, wherein one or more elements are provided to electrically interconnect at least one functional module.

16. The interface device as claimed in claim 15, wherein each electrical interconnection element is provided through the outside of the modules.

17. The interface device as claimed in claim 15, wherein each electrical interconnection element is provided inside of the modules.

18. The interface device as claimed in claim 15, wherein each electrical interconnection element is disconnectable.

19. The interface device as claimed in claim 10, wherein at least some of the electrical and/or optical devices fitted in the housing of the modules perform communication functions.

20. The interface device as claimed in claim 19, wherein the functions which may be performed by the electrical and/or optical device include matching, switching, control relaying, protecting, and signaling.

21. An interface device for connecting at least one external multipoint electrical and/or optical connector, comprising:
a linear assembly of modules, each module comprising:
an end face and a perimeter wall, which goes around the end face, delimiting an housing for an electrical and/or optical device;
an electrical and/or optical device fitted in the housing; and
a duct, with a fixed connection member extending partially into said duct, provided in the perimeter wall in order to form a part of a multipart connector complimentary to the external multipoint connector, the connection member being connected at least to the electrical and/or optical device; and
a multipart electrical and/or optical connector, configured to receive the external multipoint connector, constituted by the linear alignment of the ducts of the modules placed side by side with each module in direct contact with an adjacent module, wherein the duct of each module is opened on the side of the end face and on the opposite side.

22. An interface device for connecting at least one external multipoint electrical and/or optical connector, comprising:
a linear assembly of modules, each module comprising:
an end face and a perimeter wall, which goes around the end face, delimiting an housing for an electrical and/or optical device;
an electrical and/or optical device fitted in the housing;
an aperture provided in the perimeter wall in relation of which a electrical and/or optical connection terminal is fitted, the connection terminal forming at least a part of the electrical and/or optical device, the duct is a guiding duct in the perimeter wall and opening over its length into the wall making up the end face wall of its functional module; and
a duct, with a fixed connection member extending partially into said duct, provided in the perimeter wall in order to form a part of a multipart connector complementary to the external multipoint connector, the connection member being connected at least to the electrical and/or optical device; and
a multipart electrical and/or optical connector configured to receive the external multipoint connector, constituted by the linear alignment of the ducts of the modules placed side by side, with each module in direct contact with an adjacent module.

23. The interface device as claimed in claim 22, wherein the duct of each module is a guiding duct provided for engaging a part of the external multipoint connector.

24. The interface device as claimed in claim 22, wherein each module comprises fastening means in order to fasten the module to a next module.

25. The interface device as claimed in claim 22, wherein each module has a thickness, corresponding to the width of the perimeter wall, which is equal to a unitary or larger multiple of the pitch of two connection members of the external multipoint connector.

26. The interface device as claimed in claim 22, wherein one or more elements are provided to electrically interconnect one or more functional modules.

27. The interface device as claimed in claim 26, wherein each electrical interconnection element is provided through the outside of the modules.

28. The interface device as claimed in claim 26, wherein each electrical interconnection element is provided inside of the modules.

29. The interface device as claimed in claim 26, wherein each electrical interconnection element is disconnectable.

30. The interface device as claimed in claim 22, wherein at least some of the electrical and/or optical devices fitted in the housing of the modules perform communication functions.

31. The interface device as claimed in claim 30, wherein the functions which may be performed by the electrical and/or optical device include matching, switching, control relaying, protecting, and signaling.

32. An interface device for connecting at least one external multipoint electrical and/or optical connector, comprising:
a linear assembly of modules, each module comprising:
an end face and a perimeter wall, which goes around the end face, delimiting an housing for in electrical and/or optical device;
an electrical and/or optical device fitted in the housing;
an aperture provided in the perimeter wall in relation of which a electrical and/or optical connection terminal is fitted, the connection terminal forming at least a part of the electrical and/or optical device; and
a duct, with a fixed connection member extending partially into said duct, provided in the perimeter wall in order to form a part of a multipart connector complementary to the external multipoint connector, the connection member being connected at least to the electrical and/or optical device; and
a multipart electrical and/or optical connector configured to receive the external multipoint connector, constituted by the linear alignment of the ducts of the modules placed side by side, with each module in direct contact with an adjacent module, wherein the duct of each module is opened on the side of the end face and on the opposite side.

33. An interface device for connecting one or more external multipoint connectors used to establish one or more functional communication channels between devices which employ electrical or optical conductors, comprising:
a linear assembly of functional modules, said functional modules being positioned in alignment in said linear assembly, each functional module defining an elementary part of one or more multipart connectors formed by a plurality of said functional modules and having substantially mutually perpendicular sides,
wherein the modularly assembled multipart connector provides for direct connection, with one or more external multipoint connectors using ducts in each of two substantially mutually perpendicular sides for interconnecting one or more electrical or optical conductors which form one or more functional communication channels and
communication functions performed through the interface device are distributed among a plurality of aligned functional modules wherein at least one functional module has at least one perimeter wall having perpendicular portions and contains at least one duct located at perpendicular portions of the perimeter wall, each duct including a pin connected to an electrical or optical conductor and each duct complementary to the external connection.

34. An interface device for connecting at least one external multipoint electrical and/or optical connector, comprising:

a linear assembly of modules, each module comprising:
an end face and a perimeter wall, which goes around the end face, delimiting an housing for an electrical and/or optical device;
an electrical and/or optical device fitted in the housing; and
a duct, with a fixed connection member extending partially into said duct, provided in the perimeter wall in order to form a part of a multipart connector complimentary to the external multipoint connector, the connection member being connected at least to the electrical and/or optical device; and
a multipart electrical and/or optical connector, configured to receive the external multipoint connector, constituted by the linear alignment of the ducts of the modules placed side by side with each module in direct contact with an adjacent module, wherein the perimeter wall has perpendicular portions and the duct is located at the perpendicular portions of the perimeter wall, and the duct fixed connection member comprises a pin connected to an electrical or optical conductor and the duct being complementary to the external connection.

35. An interface device for connecting at least one external multipoint electrical and/or optical connector, comprising:

a linear assembly of modules, each module comprising:
an end face and a perimeter wall, which goes around the end face, delimiting an housing for an electrical and/or optical device;
an electrical and/or optical device fitted in the housing;
an aperture provided in the perimeter wall in relation of which a electrical and/or optical connection terminal is fitted, the connection terminal forming at least a part of the electrical and/or optical device; and
a duct with a fixed connection member extending partially into said duct, provided in the perimeter wall in order to form a part of a multipart connector complementary to the external multipoint connector the connection member being connected at least to the electrical and/or optical device; and
a multipart electrical and/or optical connector configured to receive the external multipoint connector, constituted by the linear alignment of the ducts of the modules placed side by side, with each module in direct contact with an adjacent module, wherein the perimeter wall has perpendicular portions and the duct is located at the perpendicular portions of the perimeter wall, and the duct fixed connection member comprises a pin connected to an electrical or optical conductor and the duct being complementary to the external connection.

* * * * *